US012446372B2

United States Patent
Low et al.

(10) Patent No.: US 12,446,372 B2
(45) Date of Patent: Oct. 14, 2025

(54) MICRO LIGHT EMITTING DIODE STRUCTURE

(71) Applicant: PlayNitride Display Co., Ltd., MiaoLi County (TW)

(72) Inventors: Chee-Yun Low, MiaoLi County (TW); Yun-Syuan Chou, MiaoLi County (TW); Hung-Hsuan Wang, MiaoLi County (TW); Pai-Yang Tsai, MiaoLi County (TW); Fei-Hong Chen, MiaoLi County (TW); Tzu-Yang Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 370 days.

(21) Appl. No.: 17/970,594

(22) Filed: Oct. 21, 2022

(65) Prior Publication Data

US 2024/0072210 A1    Feb. 29, 2024

(30) Foreign Application Priority Data

Aug. 24, 2022    (TW) .................................. 111131807

(51) Int. Cl.
*H10H 20/841* (2025.01)
*H10H 20/821* (2025.01)
*H10H 20/831* (2025.01)

(52) U.S. Cl.
CPC ........ *H10H 20/841* (2025.01); *H10H 20/821* (2025.01); *H10H 20/831* (2025.01)

(58) Field of Classification Search
CPC .. H10H 20/841; H10H 20/821; H10H 20/831; H10H 20/819; H10H 20/8312; H10H 20/8314
See application file for complete search history.

(56) References Cited

U.S. PATENT DOCUMENTS 9,871,169 B2    1/2018  Huang et al.
10,270,018 B2 *  4/2019  Jang ..................... H10H 20/841
(Continued)

FOREIGN PATENT DOCUMENTS

CN    112289901         1/2021
CN    113328021 A  *   8/2021   ............... G09F 9/33
(Continued)

OTHER PUBLICATIONS

"Office Action of Taiwan Counterpart Application", issued on Mar. 7, 2023, pp. 1-4.
(Continued)

*Primary Examiner* — Raj R Gupta
(74) *Attorney, Agent, or Firm* — JCIPRNET

(57) ABSTRACT

A micro light emitting diode structure including an epitaxial structure, a first insulating layer and a second insulating layer is provided. The epitaxial structure includes a first type semiconductor layer, a light emitting layer and a second type semiconductor layer. The first type semiconductor layer, the light emitting layer and a first portion of the second type semiconductor layer form a mesa. A second portion of the second type semiconductor layer is recessed relative the mesa to form a mesa surface. The first insulating layer covers from a top surface of the mesa to the mesa surface along a first side surface of the mesa, and exposes the second side surface. The second insulating layer directly covers a second side surface of the second portion, wherein a thickness ratio of the first insulating layer to the second insulating layer is between 10 and 50.

9 Claims, 10 Drawing Sheets

(56) References Cited

U.S. PATENT DOCUMENTS

| | | | |
|---|---|---|---|
| 2005/0211989 A1* | 9/2005 | Horio | H10H 20/832 |
| | | | 257/E33.068 |
| 2017/0323873 A1 | 11/2017 | Lin et al. | |
| 2018/0197461 A1 | 7/2018 | Lai et al. | |
| 2018/0240950 A1* | 8/2018 | Jang | H10H 20/853 |
| 2022/0059579 A1* | 2/2022 | Zhang | H10D 86/60 |

FOREIGN PATENT DOCUMENTS

| | | | |
|---|---|---|---|
| JP | 2003224297 A * | 8/2003 | |
| KR | 20170072669 | 6/2017 | |
| KR | 20200095060 | 8/2020 | |
| TW | 202013764 | 4/2020 | |
| TW | 202036933 | 10/2020 | |
| TW | I746293 | 11/2021 | |
| TW | 202218188 | 5/2022 | |

OTHER PUBLICATIONS

"Office Action of China Counterpart Application", issued on Apr. 26, 2025, p. 1-p. 8.

\* cited by examiner

MICRO LIGHT EMITTING DIODE STRUCTURE

CROSS-REFERENCE TO RELATED APPLICATION

This application claims the priority benefit of Taiwan application serial no. 111131807, filed on Aug. 24, 2022. The entirety of the above-mentioned patent application is hereby incorporated by reference herein and made a part of this specification.

BACKGROUND

Technical Field

The invention relates to a light emitting structure, and particularly relates to a micro light emitting diode structure.

Description of Related Art

In the prior art, a main manufacturing process of a micro light emitting diode (LED) is performed on an epitaxial substrate, and the epitaxial substrate is removed after the manufacturing process is completed, and the micro LED is transferred to a temporary carrier substrate. In the above manufacturing process, an insulating layer (with a thickness ranging from about 0.5 μm to 1 μm) for electrical passivation is formed on a surface of the micro LED, and the insulating layer extends from a top surface of the micro LED structure along a peripheral surface thereof to cover a surface of the epitaxial substrate. However, since the insulating layer has a certain thickness, when a laser lift-off (LLO) procedure is performed to remove the epitaxial substrate, it is prone to cause the epitaxial insulating layer to remain on the peripheral surface of the lifted-off micro LED, thereby adversely affecting a post-transfer process.

SUMMARY

The invention is directed to a micro light emitting diode structure, which solves the problem that the epitaxial insulating layer remains on the peripheral surface of the lifted-off micro LED in the prior art, and have better structural reliability, and is adapted to improve an overall process yield while considering a light emitting efficiency.

The invention provides a micro light emitting diode structure including an epitaxial structure, a first insulating layer and a second insulating layer. The epitaxial structure includes a first type semiconductor layer, a light emitting layer and a second type semiconductor layer. The light emitting layer is located between the first type semiconductor layer and the second type semiconductor layer. The first type semiconductor layer, the light emitting layer and a first portion of the second type semiconductor layer form a mesa. The mesa has a top surface and a first side surface. A second portion of the second type semiconductor layer is recessed relative to the mesa to form a mesa surface. The second portion of the second type semiconductor layer has a second side surface. The mesa surface is located between the first side surface and the second side surface. The first insulating layer covers from the top surface of the mesa to the mesa surface along the first side surface, and exposes the second side surface. The second insulating layer directly covers the second side surface, wherein a thickness ratio of the first insulating layer to the second insulating layer is between 10 and 50.

The invention provides a micro light emitting diode structure including an epitaxial structure, a first insulating layer and a second insulating layer. The epitaxial structure includes a first type semiconductor layer, a light emitting layer and a second type semiconductor layer. The light emitting layer is located between the first type semiconductor layer and the second type semiconductor layer. The first type semiconductor layer, the light emitting layer and a first portion of the second type semiconductor layer form a mesa. The mesa has a top surface and a first side surface. A second portion of the second type semiconductor layer is recessed relative to the mesa to form a mesa surface. The second portion of the second type semiconductor layer has a second side surface. The mesa surface is located between the first side surface and the second side surface. The first insulating layer directly covers from the top surface of the mesa to the mesa surface along the first side surface, and exposes the second side surface, wherein the first insulating layer covering the first side surface forms a continuous surface with the second side surface. The second insulating layer is disposed on the first insulating layer, and directly covers the continuous surface, wherein the first insulating layer directly contacts the second insulating layer.

Based on the above description, in the design of the micro LED structure of the invention, the first insulating layer covers from the top surface of the mesa to the mesa surface along the first side surface, and exposes the second side surface of the second portion of the second type semiconductor layer, and the second insulating layer directly covers the second side surface, where the thickness ratio of the first insulating layer to the second insulating layer is between 10 and 50. Namely, the first insulating layer with thicker thickness does not extend to the substrate, which may solve the problem that the epitaxial insulating layer remains on the peripheral surface of the lifted-off micro LED in the prior art, while the second insulating layer with thinner thickness and directly covering the second side surface may passivate the second side surface to improve the light emitting efficiency. Therefore, the micro LED structure of the invention may have better structural reliability and light emitting efficiency, and meanwhile an overall process yield is improved.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
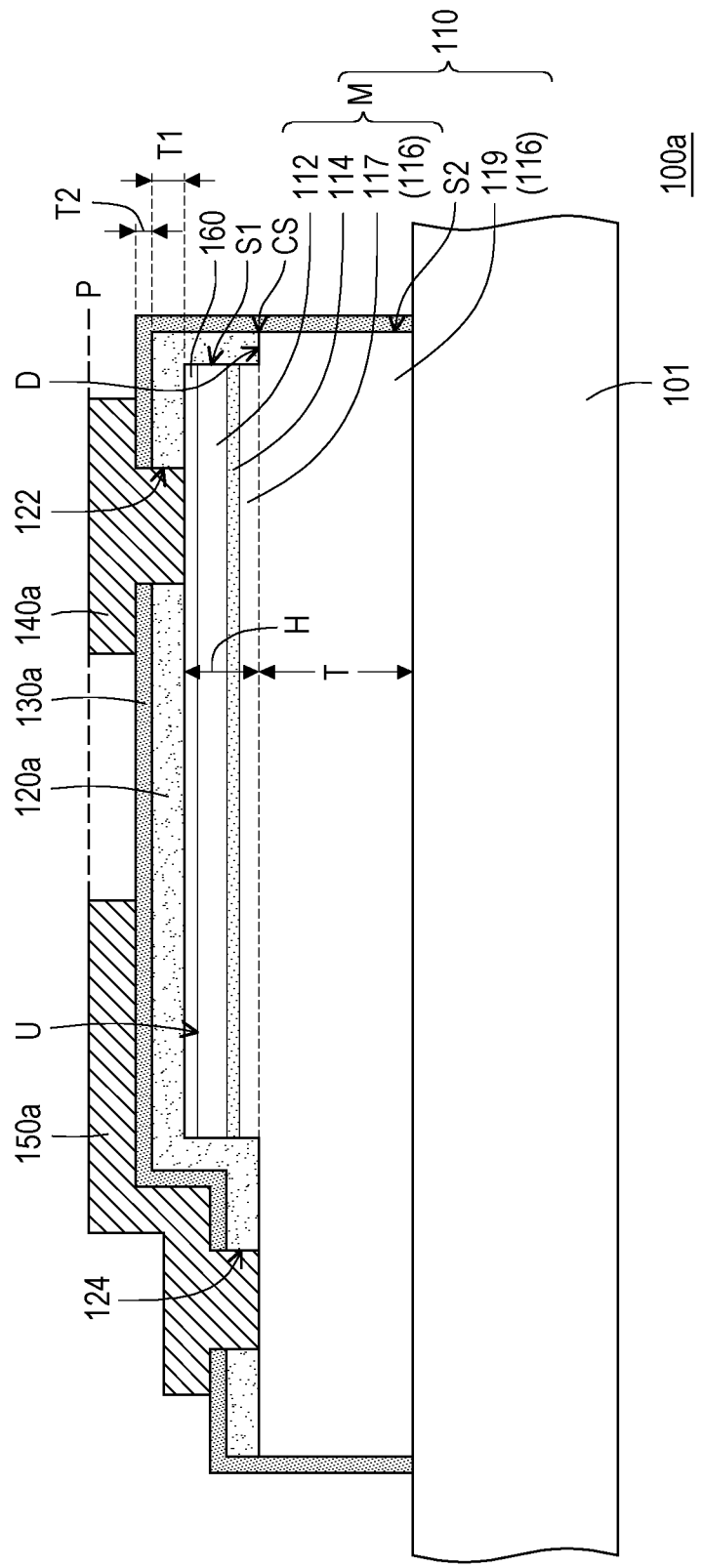
FIG. 1 is a schematic cross-sectional view of a micro LED structure according to an embodiment of the invention.

FIG. 1 is a schematic cross-sectional view of a micro LED structure according to an embodiment of the invention. Referring to FIG. 1, in the embodiment, a micro LED structure 100a includes an epitaxial structure 110, a first insulating layer 120a and a second insulating layer 130a. The epitaxial structure 110 may be disposed on a substrate 101, and the epitaxial structure 110 includes a first type semiconductor layer 112, a light emitting layer 114 and a second type semiconductor layer 116, where the light emitting layer 114 is located between the first type semiconductor layer 112 and the second type semiconductor layer 116. The first type semiconductor layer 112, the light emitting layer 114 and a first portion 117 of the second type semiconductor layer 116 form a mesa M. The mesa M has a top surface U and a first side surface S1, where an extending direction of the top surface U may be perpendicular to an extending direction of the first side surface S1. A second portion 119 of the second type semiconductor layer 116 is recessed relative to the mesa M to form a mesa surface D, and the second portion 119 of the second type semiconductor layer 116 has a second side surface S2, where an extending direction of the mesa surface D may be perpendicular to an extending direction of the second side surface S2. The mesa surface D is located between the first side surface S1 and the second side surface S2, and the mesa surface D may be parallel to the top surface U. The first insulating layer 120a covers from the top surface U of the mesa M to the mesa surface D along the first side surface S1, and exposes the second side surface S2. The second insulating layer 130a directly covers the second side surface S2, where the thickness ratio of the first insulating layer 120a to the second insulating layer 130a is between 10 and 50. Namely, the first insulating layer 120a in the embodiment does not cover the second side surface S2, and the second side surface S2 is only directly covered by the second insulating layer 130a.

Further, in the embodiment, the first type semiconductor layer 112 is, for example, a P type semiconductor layer, the light emitting layer 114 is, for example, a multi quantum well (MWQ) structure, and the second type semiconductor layer 116 is, for example, an N type semiconductor layer, but the invention is not limited thereto. Furthermore, the micro LED structure 100a of the embodiment further includes a current distribution layer 160 disposed between the first insulating layer 120a and the first type semiconductor layer 112, where the current distribution layer 160 and the first type semiconductor layer 112 forms ohmic contact. Here, the current distribution layer 160 directly contacts the top surface U of the mesa M, and an orthographic projection of the current distribution layer 160 on the top surface U may be equal to the top surface U, but the invention is not limited thereto. A material of the current distribution layer 160 may be, for example, indium tin oxide, indium oxide, tin oxide, zinc aluminum oxide, cadmium tin oxide, antimony tin oxide, zinc oxide, or a combination of the above materials. A thickness of the mesa M plus a thickness of the current distribution layer 160 is a height H, where the height H is less than a thickness T of the second portion 119 of the second type semiconductor layer 116. The height H is, for example, 1 µm to 2 µm, and the thickness T is, for example, 3 µm to 5 82 m.

In particular, as shown in FIG. 1, the first insulating layer 120a directly covers the mesa surface D, i.e., the mesa surface D only contacts the first insulating layer 120a, and the first insulating layer 120a covering the first side surface S1 forms a continuous surface CS together with the second side surface S2. In a cross-sectional view, the continuous surface CS is a straight line, for example, a straight line extending along a normal direction of the substrate 101, but the invention is not limited thereto. The second insulating layer 130a directly covers the first insulating layer 120a on the continuous surface CS, and extends along the continuous surface CS to cover the first insulating layer 120a on the mesa surface D and the top surface U, where a thickness T2 of the second insulating layer 130a is smaller than the thickness T1 of the first insulating layer 120a. The thickness T1 of the first insulating layer 120a is, for example, between 0.5 µm and 1 µm, and the thickness T2 of the second insulating layer 130a is, for example, between 20 nm and 50 nm. On the mesa M and the mesa surface D, the first insulating layer 120a and the second insulating layer 130a are conformally disposed, which means that a total thickness of the insulating layers is the thickness T1 of the first insulating layer 120a plus the thickness T2 of the second insulating layer 130a, and on the second side surface S2, the total thickness of the insulating layer only includes the thickness T2 of the second insulating layer 130a.

Furthermore, in the embodiment, a material of the first insulating layer 120a is substantially different from a material of the second insulating layer 130a. In an embodiment, the first insulating layer 120a may be, for example, a physical deposition film, and the second insulating layer 130a may be, for example, a chemical deposition film. The above-mentioned physical deposition mean that a target is not subjected to chemical reactions, and a raw material is directly formed on the target by means of an external force, etc.; and the chemical deposition mean that the target reacts in a chemical gas or on a surface of the target to form different compounds and deposit into a film. In an embodiment, the first insulating layer 120a and the second insulating layer 130a may be respectively a single-layer film layer or a multi-layer film layer. In an embodiment, the first insulating layer 120a may be, for example, a distributed Bragg reflector layer of silicon dioxide ($SiO_2$)/titanium dioxide ($TiO_2$) formed by sputtering, and the second insulating layer 130a may be, for example, atomic layer deposition (ALD) coated aluminum oxide ($Al_2O_3$) or hafnium dioxide ($HfO_2$) or chemical vapor deposition (CVD) coated silicon dioxide ($SiO_2$)/silicon nitride ($Si_xN_x$). When the second insulating layer 130a is formed by atomic layer deposition or chemical vapor deposition, it may have a better step coverage on the second side surface S2, where a process temperature of the second insulating layer 130a may be slightly higher than a process temperature of the first insulating layer 120a. In an embodiment, a compactness of the second insulating layer 130a may be higher than that of the first insulating layer 120a due to a difference in process and material selection.

As shown in FIG. 1, the thicker first insulating layer 120a of the embodiment directly covers a peripheral surface (i.e., the first side surface S1) of the first type semiconductor layer 112, the light emitting layer 114 and the second type semiconductor layer 116, so as to ensure an electrical passivation effect. Moreover, the second portion 119 of the second type semiconductor layer 116 is only directly covered with the second insulating layer 130a with a thinner thickness, so that during the laser lift-off (LLO) process, the second insulating layer (not shown) deposited on the substrate may be vaporized or broken, and the second insulating layer 130a will not remain at the bottom of the second portion 119. The arrangement of the first insulating layer 120a not only has the effect of electrical isolation, but also has the effect of vertically reflecting the light of the light emitting layer 114 to a light exiting surface; and the thinner second insulating layer 130a directly covers the second side surface S2, so that the arrangement of the second insulating layer 130a may passivate the second side surface S2, so as to reduce defects of non-radiative recombination, thereby improving the light emitting efficiency of the micro LED structure 100a. In brief, the micro LED structure 100a of the embodiment has both of the thicker first insulating layer 120a and the thinner second insulating layer 130a directly contacting the first insulating layer 120a, so that both of structural reliability and transfer yield may be taken into account.

In addition, referring to FIG. 1 again, the micro LED structure 100a of the embodiment further includes a first electrode 140a and a second electrode 150a. The first electrode 140a is electrically connected to the first type semiconductor layer 112. The second electrode 150a is electrically connected to the second type semiconductor layer 116, where the first electrode 140a and a part of the second electrode 150a are located on a same plane P. More specifically, the first insulating layer 120a and the second insulating layer 130a expose the first type semiconductor layer 112 on the top surface U to form a first opening 122, and expose the second portion 119 of the second type semiconductor layer 116 on the mesa surface D to form a second opening 124. The first electrode 140a is disposed in the first opening 122 and extends to the second insulating layer 130a. The second electrode 150a is disposed on the second insulating layer 130a and extends into the second opening 124. Since the second insulating layer 130a and the first insulating layer 120a are conformally disposed on the mesa M and the mesa surface D, the second insulating layer 130a also exposes the current distribution layer 160 exposed by the first opening 122 and the second portion 119 of the second type semiconductor layer 116 exposed by the second opening 124.

Since the first insulating layer 120a covers from the top surface U of the mesa M to the mesa surface D along the first side surface S1, and exposes the second side surface S2 of the second portion 119 of the second type semiconductor layer 116, i.e., the first insulating layer 120a does not extend to the substrate 101, it may solve the problem that the epitaxial insulating layer remains on the peripheral surface of the lifted-off micro LED in the prior art, so as to avoid adversely affecting the subsequent transfer process. In addition, the thickness ratio of the first insulating layer 120a to the second insulating layer 130a is between 10 and 50, which represents that the thicker first insulating layer 120a mainly covers a sidewall of the light-emitting layer 114; and the second insulating layer 120a directly covering the second side surface S2 has an obviously thinner thickness, which may passivate the second side surface S2 to improve the light emitting efficiency, and will not affect the subsequent transfer step of the micro LED structure 100a.

It should be noticed that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 2:
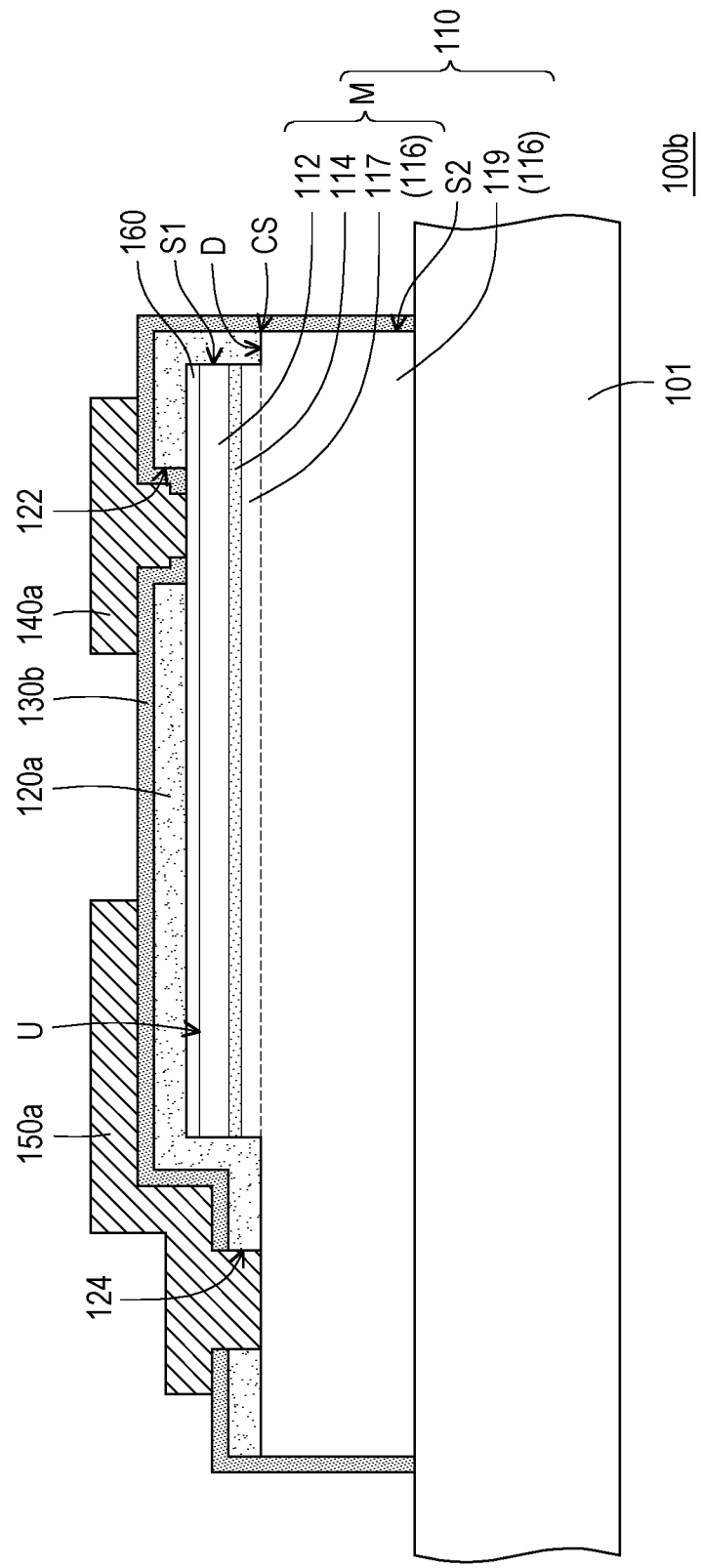
FIG. 2 is a schematic cross-sectional view of a micro LED structure according to another embodiment of the invention.

FIG. 2 is a schematic cross-sectional view of a micro LED structure according to another embodiment of the invention. Referring to FIG. 1 and FIG. 2 together, a micro LED structure 100b of the embodiment is similar to the micro LED structure 100a of FIG. and a difference there between is that in the embodiment, the second insulating layer 130 closes the first insulating layer 120a and a part of the current distribution layer 160 at a position of the first opening 122 or the second opening 124 to protect the first insulating layer 120a. FIG. 2 schematically shows that the second insulating layer 130 closes the first insulating layer 120a at the position of the first opening 122, and in other embodiments that are not shown, the second insulating layer 130 may also close the first insulating layer 120a at the position of the second opening 124. At this time, the first electrode 140a only contacts the current distribution layer 160 and the second insulating layer 140a, but does not contact the first insulating layer 120a.

Figure 3:
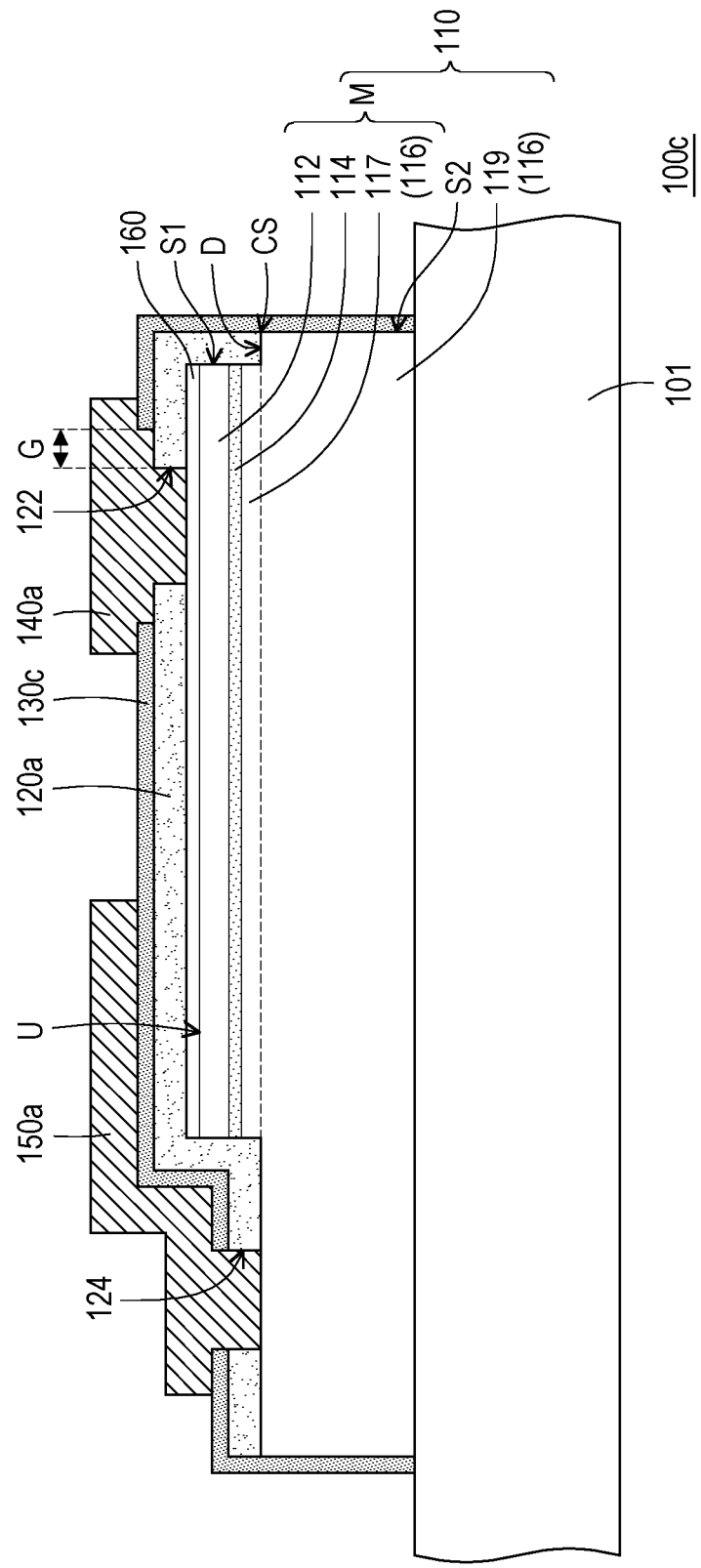
FIG. 3 is a schematic cross-sectional view of a micro LED structure according to another embodiment of the invention.

FIG. 3 is a schematic cross-sectional view of a micro LED structure according to another embodiment of the invention. Referring to FIG. 1 and FIG. 3 together, a micro LED structure 100c of the embodiment is similar to the micro LED structure 100a of FIG. 1, and a difference there between is that a second insulating layer 130c is retracted by a distance G relative to the first insulating layer 120a at the position of the first opening 122 or the second opening 124, so as to expose a part of the first insulating layer 120a, i.e., expose more contact area of the current distribution layer 160 to contact the first electrode 140a, which may have better ohmic contact. FIG. 3 schematically shows that the second insulating layer 130c is retracted by the distance G relative to the first insulating layer 120a at the position of the first opening 122, and in other embodiments that are not shown, the second insulating layer 130c may also be retracted by the distance G relative to the first insulating layer 120a at the position of the second opening 124, so that the second portion 119 of the second type semiconductor layer 116 (or another current distribution layer that is not shown) may be fully exposed to the second opening 124 to achieve better ohmic contact with the second electrode 150a. Here, an orthographic projection of the second insulating layer 130c on the epitaxial structure 110 is not overlapped with an orthographic projection of a connection surface of the first electrode 140a and the current distribution layer 160 on the epitaxial structure 110.

Figure 4:
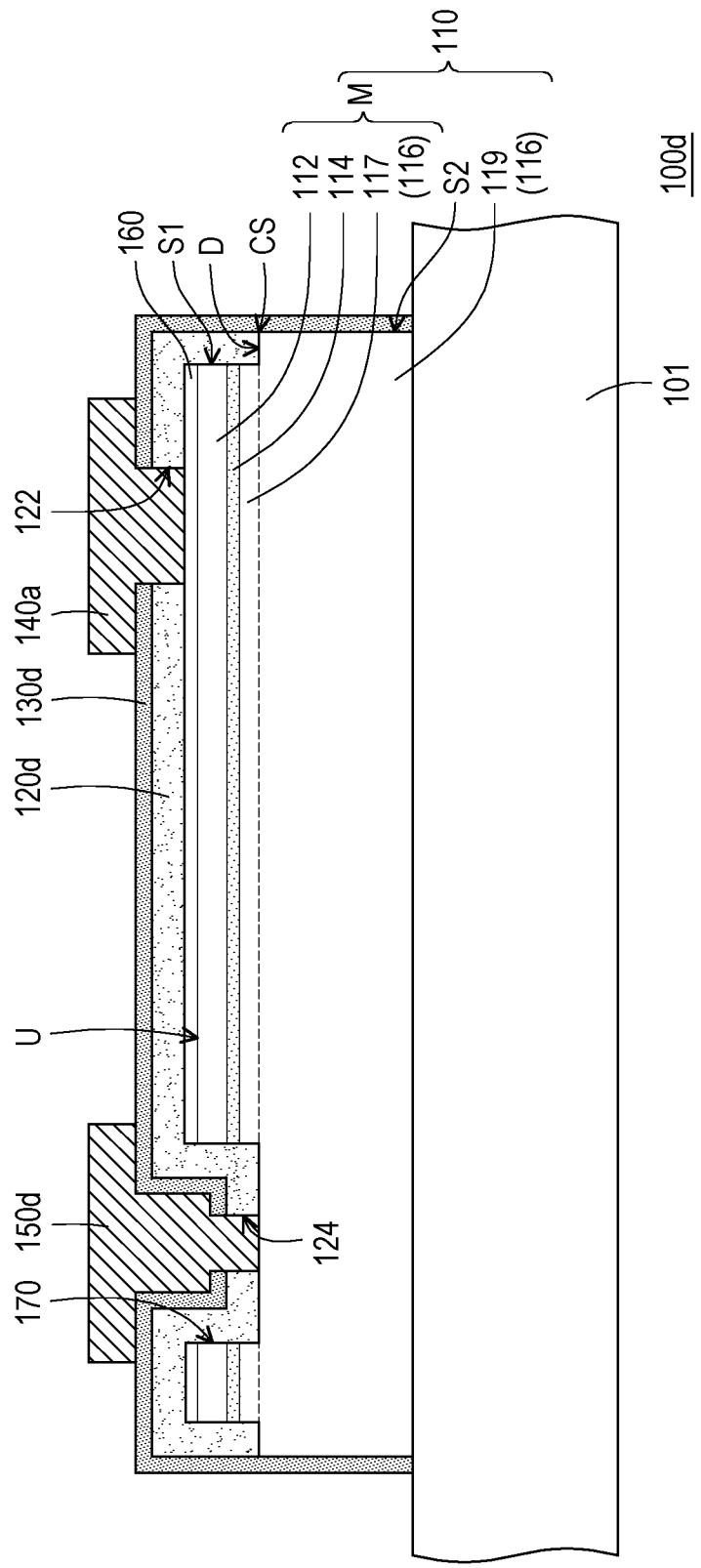
FIG. 4 is a schematic cross-sectional view of a micro LED structure according to another embodiment of the invention.

FIG. 4 is a schematic cross-sectional view of a micro LED structure according to another embodiment of the invention. Referring to FIG. 1 and FIG. 4 together, a micro LED structure 100d of the embodiment is similar to the micro LED structure 100a of FIG. 1, and a difference there between is that in the embodiment, the micro LED structure 100d further includes a through hole 170 penetrating through the current distribution layer 160, the first type semiconductor layer 112, the light emitting layer 114 and a part of the second type semiconductor layer 116. A first insulating layer 120d further extends to cover an inner wall of the through hole 170, and a second electrode 150d extends into the through hole 170 and is electrically connected to the second type semiconductor layer 116. At this time, since the second insulating layer 130*d* is in direct contact with and is conformal to the first insulating layer 120*d*, the second insulating layer 130*d* also extends into the through hole 170 at the second opening 124.

Figure 5:
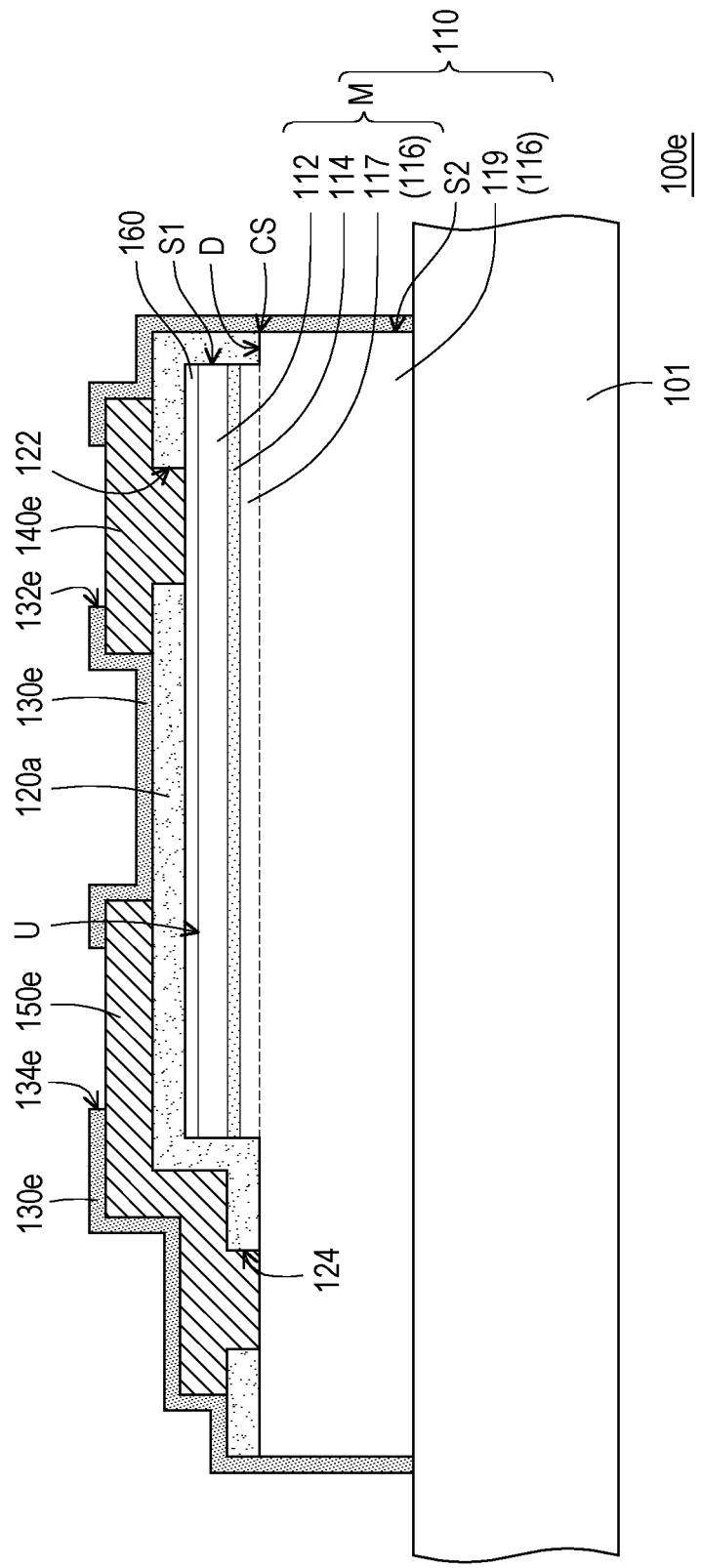
FIG. 5 is a schematic cross-sectional view of a micro LED structure according to another embodiment of the invention.

FIG. 5 is a schematic cross-sectional view of a micro LED structure according to another embodiment of the invention. Referring to FIG. 1 and FIG. 5 together, a micro LED structure 100*e* of the embodiment is similar to the micro LED structure 100*a* of FIG. 1, and a difference there between is that in the embodiment, on the mesa M and the mesa surface D, a part of a second insulating layer 130*e* does not directly contact the first insulating layer 120*a*. In detail, a first electrode 140*e* and a second electrode 150*e* are located between the first insulating layer 120*a* and the second insulating layer 130*e*, i.e., the first electrode 140*e* and the second electrode 150*e* separate the first insulating layer 120*a* and the second insulating layer 130*e*, which may reduce/avoid a chance of short circuit between the first electrode 140*e* and the second electrode 150*e* caused by subsequent solder bump overflow. The second insulating layer 130*e* is formed after the first electrode 140*e* and the second electrode 150*e* are formed, so that the second insulating layer 130*e* may define a third opening 132*e* exposing the first electrode 140*e* and a fourth opening 134*e* exposing the second electrode 150*e* by means of patterned etching, so that the subsequent solder bumps may be electrically connected to the first electrode 140*e* and the second electrode 150*e* respectively through the third opening 132*e* and the fourth opening 134*e*. Here, the micro LED structure 100*e* may be, for example, a red micro LED structure.

Figure 6:
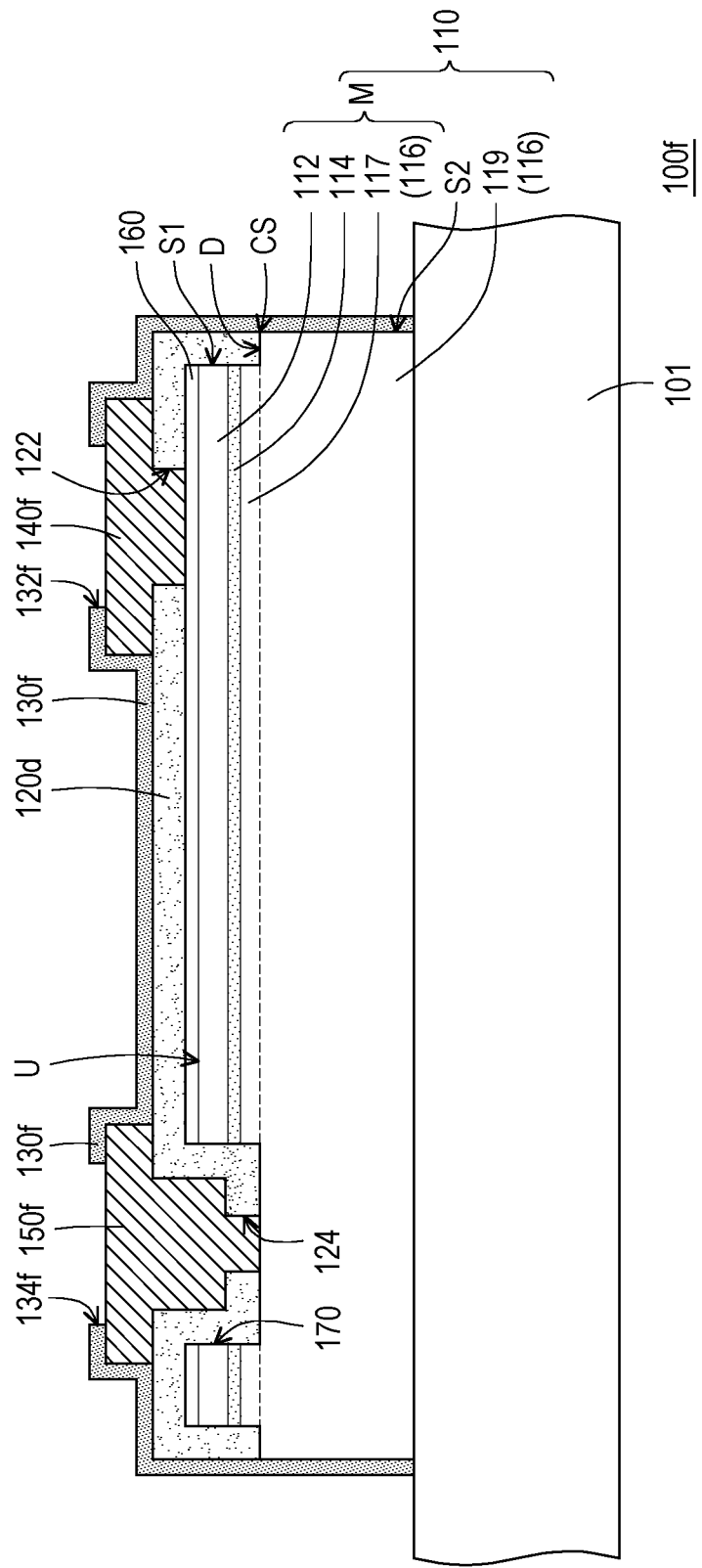
FIG. 6 is a schematic cross-sectional view of a micro LED structure according to another embodiment of the invention.

FIG. 6 is a schematic cross-sectional view of a micro LED structure according to another embodiment of the invention. Referring to FIG. 4 and FIG. 6 together, a micro LED structure 100*f* of the embodiment is similar to the micro LED structure 100d of FIG. 4, and a difference there between is that in the embodiment, on the mesa M and the mesa surface D, a part of a second insulating layer 130*f* does not directly contact the first insulating layer 120*d*. In detail, a first electrode 140*f* and a second electrode 150*f* are located between the first insulating layer 120*d* and the second insulating layer 130*f*, which means that the first electrode 140*f* and the second electrode 150*f* separate the first insulating layer 120*d* and the second insulating layer 130*f*, which may reduce/avoid a chance of short circuit between the first electrode 140*f* and the second electrode 150*f* caused by subsequent solder bump overflow. In the embodiment of FIG. 6, since the second insulating layer 130*f* is formed after the first electrode 140*f* and the second electrode 150*f* are formed, the second insulating layer 130*f* does not extend into the through hole 170, and has a third opening 132*f* exposing the first electrode 140*f* and a fourth opening 134*f* exposing the second electrode 150*f*, so that the subsequent solder bumps may be electrically connected to the first electrode 140*f* and the second electrode 150*f* through the third opening 132*f* and the fourth opening 134*f*, respectively. In other words, the second insulating layer 130*f* respectively exposes the first electrode 140*f* and the second electrode 150*f* at the positions of the first opening 122 and the second opening 124. Here, the micro LED structure 100*f* may be, for example, a red micro LED structure.

Figure 7:
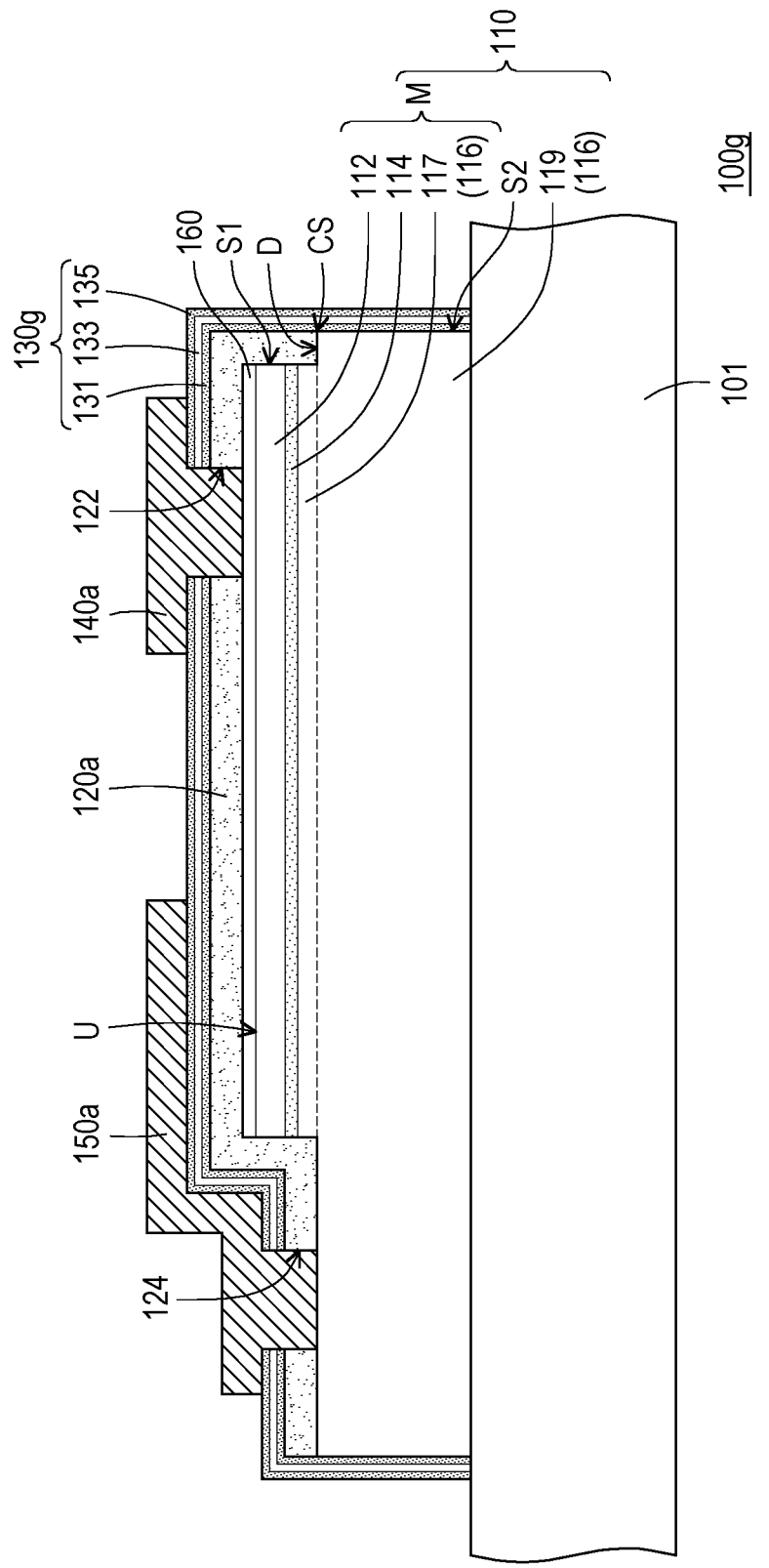
FIG. 7 is a schematic cross-sectional view of a micro LED structure according to another embodiment of the invention.

FIG. 7 is a schematic cross-sectional view of a micro LED structure according to another embodiment of the invention. Referring to FIG. 1 and FIG. 7 together, a micro LED structure 100*g* of the embodiment is similar to the micro LED structure 100*a* of FIG. 1, and a difference there between is that: in the embodiment, at least one of the first insulating layer 120*a* and a second insulating layer 130*g* is a distributed Bragg reflector layer. In the embodiment, the second insulating layer 130*g* is a distributed Bragg reflector layer, which includes a plurality of film layers 131, 133, 135 stacked alternately and having different refractive indexes, which may amplify a critical angle of internal reflection to increase light extraction of the light exiting surface. The film layers 131, 133 and 135 may be respectively oxide layers or nitride layers, but the invention is not limited thereto. A thicknesses of the film layers is designed according to different needs. In detail, according to a thin-film interference equation, a film thickness d conforms to: $2n_{film}d\cos(\theta)=m\lambda$ under constructive interference. When a design requirement of the distributed Bragg reflector layer is destructive interference, it means that the reflected light in the film layer is designed to have a phase difference (a situation of phase reversal is not discussed here), the film thickness d at this time conforms to $$2n_{film}d\cos(\theta) = \left(m - \frac{1}{2}\right)\lambda,$$

where θ represents an incident angle of light entering another film layer from each layer of medium such as the film layers 131, 133 and 135, n represents a refractive index of the film layer, m represents any positive integer, and λ represents a light emitting wavelength of the light emitting layer. According to the above description, the film thickness d is determined by a refractive index of the selected material and control requirements on a light exiting angle range of the micro LED, and the thickness of the film layers 131, 133 and 135 may be adjusted experimentally based on the above-mentioned thin-film interference principle. Since the thin-film interference belongs to the existing optical knowledge, details thereof are not repeated. Preferably, the thickness of each film layer 131, 133, and 135 may be between ¼ and ½ of a light emitting wavelength of the light emitting layer 114, which may change a path of the internal reflection of the micro LED structure 100*g* to reduce a loss of internal reflection of light. It should be noted that, in another embodiment that is not shown, the first insulating layer may also be a distributed Bragg reflector layer, or the first insulating layer and the second insulating layer may be respectively a distributed Bragg reflector layer, where a thickness of the film layers in the first insulating layer may be different from a thickness of the film layers in the second insulating layer, which still belongs to a protection scope of the invention.

Figure 8:
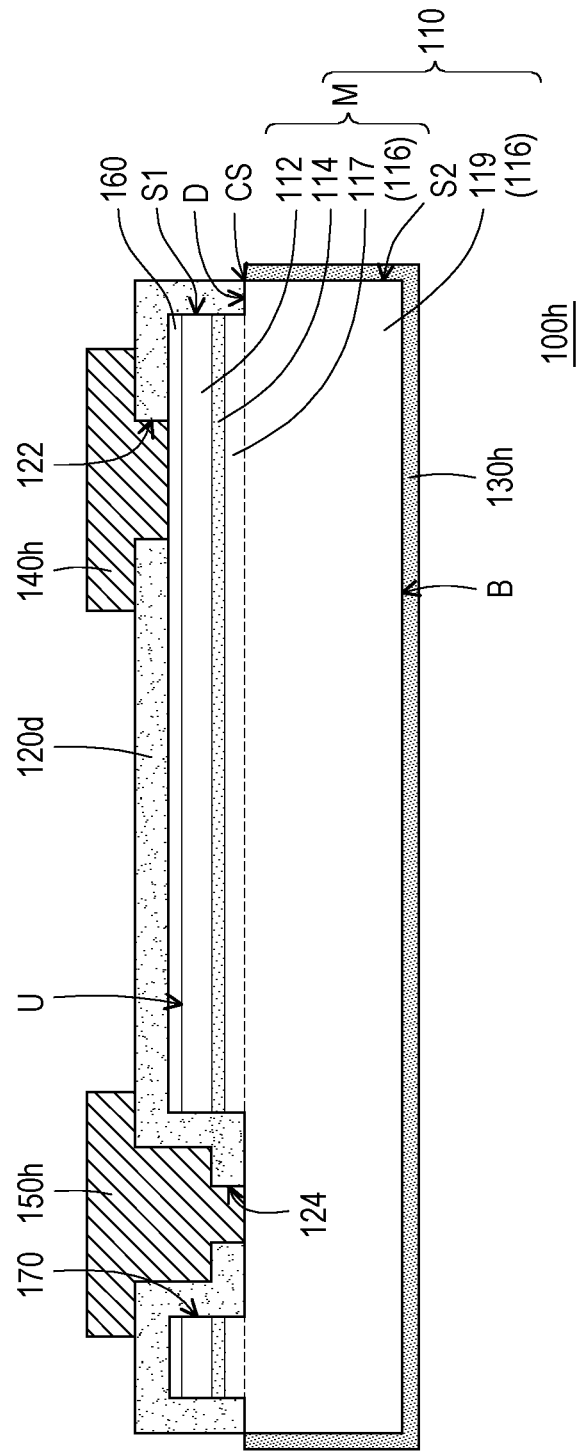
FIG. 8 is a schematic cross-sectional view of a micro LED structure according to another embodiment of the invention.

FIG. 8 is a schematic cross-sectional view of a micro LED structure according to another embodiment of the invention. Referring to FIG. 4 and FIG. 8 together, a micro LED structure 100*h* of the embodiment is similar to the micro LED structure 100d of FIG. 4, and a difference there between is that: in the embodiment, a second insulating layer 130*h* does not directly contact the first insulating layer 120*d*. In detail, the second portion 119 of the second type semiconductor layer 116 further has a bottom surface B opposite to the mesa surface D, where the bottom surface B may be parallel to the mesa surface D, and the second side surface S2 may vertically connect the mesa surface D and the bottom surface B. The second insulating layer 130*h* extends from the second side surface S2 and directly covers the bottom surface B, and the second insulating layer 130*h* is not overlapped with and in contact with the first insulating layer 120d. At this time, the first insulating layer 120d and the second insulating layer 130h surround the peripheral surface of the epitaxial structure 110, and there is only the first insulating layer 120d on the mesa M and the mesa surface D, and there is only the second insulating layer 130h on the bottom surface B of the second portion 119 of the second type semiconductor layer 116 and the second side surface S2. A first electrode 140h directly contacts the first insulating layer 120d and the current distribution layer 160, and a second electrode 150h directly contacts the first insulating layer 120d and the second type semiconductor layer 116 exposed by the through hole 170.

Figure 9:
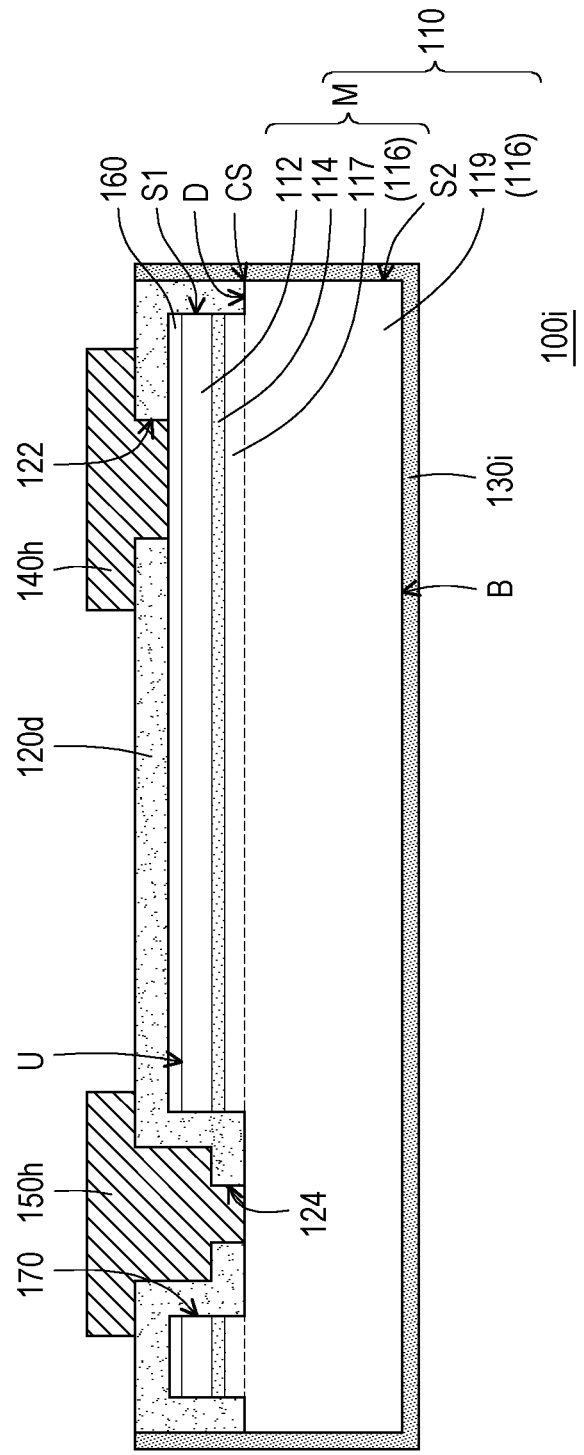
FIG. 9 is a schematic cross-sectional view of a micro LED structure according to
another embodiment of the invention.

FIG. 9 is a schematic cross-sectional view of a micro LED structure according to another embodiment of the invention. Referring to FIG. 8 and FIG. 9 together, a micro LED structure 100i of the embodiment is similar to the micro LED structure 100h of FIG. 8, and a difference there between is that: in the embodiment, a second insulating layer 130i further extends to cover the first insulating layer 120d on the first side surface S1, and is aligned with the first insulating layer 120d on the top surface U of the mesa M. Therefore, on the first side surface S1, the first insulating layer 120d is in direct contact with the second insulating layer 130i.

Figure 10:
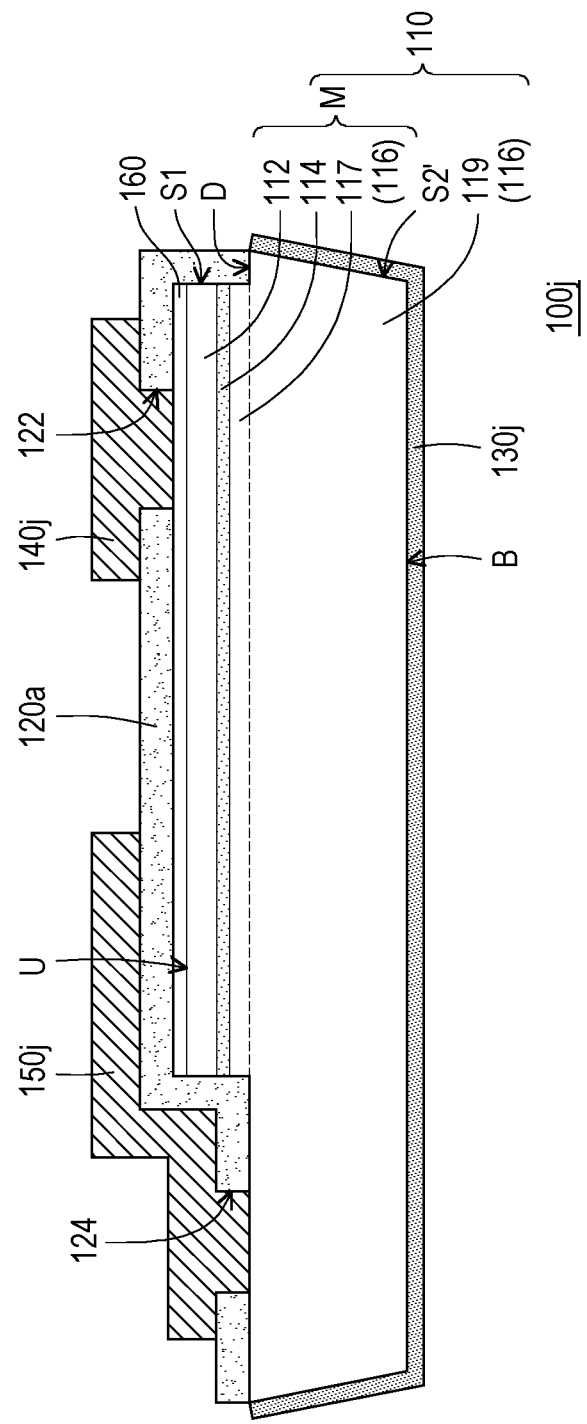
FIG. 10 is a schematic cross-sectional view of a micro LED structure according to another embodiment of the invention.

FIG. 10 is a schematic cross-sectional view of a micro LED structure according to another embodiment of the invention. Referring to FIG. 1 and FIG. 10 together, a micro LED structure 100j of the embodiment is similar to the micro LED structure 100a of FIG. 1, and a difference there between is that: in the embodiment, a second insulating layer 130j does not directly contact the first insulating layer 120a, and the first insulating layer 120a covering the first side surface S1 is discontinuous with a second side surface S2'. In detail, the second portion 119 of the second type semiconductor layer 116 further has a bottom surface B opposite to the mesa surface D, where the bottom surface B may be parallel to the mesa surface D, and the second side surface S2' may obliquely connect the mesa surface D and the bottom surface B. Namely, the second side surface S2' is inclined with respect to the bottom surface B, which may increase light reflection, thereby increasing a light output. The second insulating layer 130j directly covers the second side surface S2' and the bottom surface B, and the second insulating layer 130j is not overlapped with and in contact with the first insulating layer 120a. At this time, the first insulating layer 120a and the second insulating layer 130j surround the peripheral surface of the epitaxial structure 110, and there is only the first insulating layer 120a on the mesa M and the mesa surface D, and there is only the second insulating layer 130j on the bottom surface B of the second portion 119 of the second type semiconductor layer 116 and the second side surface S2'. A first electrode 140j directly contacts the first insulating layer 120a and the current distribution layer 160, and a second electrode 150j directly contacts the first insulating layer 120a and the second type semiconductor layer 116 exposed by the second opening 124.

It should be noted that the second insulating layers 130h, 130i, 130j in the micro LED structures of FIG. 8 to FIG. 10 extend and cover from the bottom surface B in a direction toward the top surface U. In an actual process, the second insulating layers 130h, 130i, 130j and the first insulating layers 120a, 120d may be respectively formed in different stages. In detail, the first insulating layers 120a and 120d are first formed in a process stage of chip on wafer; and in the embodiments of FIG. 8 to FIG. 10, the second insulating layers 130h, 130i, 130j are formed after the micro LED structures 100h, 100i, 100j are flipped and transferred to a temporary carrier substrate, thus presenting a covering direction opposite to the first insulating layers 120a, 120d.

In other words, during the process stage of chip on wafer, only the first insulating layers 120a and 120d may be formed, and the second side surfaces S2 and S2' may be left exposed.

After the micro LED structures 100h, 100i, 100j are flipped, the second insulating layers 130h, 130i, and 130j may be implemented in various ways according to different design purposes or different film forming methods. For example, in FIG. 8, the second insulating layer 130h only extends to cover the mesa surface D. For another example, as shown in FIG. 9, the second insulating layer 130i may continue to cover along the continuous surface CS, and may be finally aligned with the first insulating layer 120d located at the top surface U. In addition, for some embodiments such as FIG. 10, the second insulating layer 130j formed after the transfer process may also cover the inclined second side surface S2' in a better way, so as to ensure that all peripheral surface of the micro LED structure 100j is well insulated.

In this way, when the micro LED structures 100h, 100i, and 100j are transferred, since the second insulating layers 130h, 130i, and 130j have not been formed, the residual problem caused by incomplete laser lift-off may be completely avoided.

In summary, in the design of the micro LED structure of the invention, the first insulating layer covers from the top surface of the mesa to the mesa surface along the first side surface, and exposes the second side surface of the second portion of the second type semiconductor layer, and the second insulating layer directly covers the second side surface, where the thickness ratio of the first insulating layer to the second insulating layer is between 10 and 50. Namely, the first insulating layer with thicker thickness does not extend to the substrate, which may solve the problem that the epitaxial insulating layer remains on the peripheral surface of the lifted-off micro LED in the prior art, while the second insulating layer with thinner thickness and directly covering the second side surface may passivate the second side surface to improve the light emitting efficiency. Therefore, the micro LED structure of the invention may have better structural reliability and light emitting efficiency.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A micro light emitting diode structure, comprising:
an epitaxial structure, comprising a first type semiconductor layer, a light emitting layer and a second type semiconductor layer, wherein the light emitting layer is located between the first type semiconductor layer and the second type semiconductor layer, the first type semiconductor layer, the light emitting layer and a first portion of the second type semiconductor layer form a mesa, the mesa has a top surface and a first side surface, and a second portion of the second type semiconductor layer is recessed relative to the mesa to form a mesa surface, the second portion has a second side surface, and the mesa surface is located between the first side surface and the second side surface;

a first insulating layer, covering from the top surface of the mesa to the mesa surface along the first side surface, and exposing the second side surface; and a second insulating layer, directly covering the second side surface, wherein a thickness ratio of the first insulating layer to the second insulating layer is between 10 and 50, wherein a compactness of the second insulating layer is higher than a compactness of the first insulating layer, the second portion of the second type semiconductor layer further has a bottom surface opposite to the mesa surface, the second side surface connects the mesa surface and the bottom surface, and the second insulating layer extends and distributes from the second side surface and directly covers the bottom surface.

2. The micro light emitting diode structure as claimed in claim 1, wherein the first insulating layer directly covers the mesa surface, and the first insulating layer covering the first side surface forms a continuous surface with the second side surface.

3. The micro light emitting diode structure as claimed in claim 1, wherein the first insulating layer is a physical deposition film, and the second insulating layer is a chemical deposition film.

4. The micro light emitting diode structure as claimed in claim 1, wherein a material of the first insulating layer is different from a material of the second insulating layer.

5. The micro light emitting diode structure as claimed in claim 1, wherein a thickness of the second insulating layer is between 20 nm and 50 nm.

6. The micro light emitting diode structure as claimed in claim 1, wherein at least one of the first insulating layer and the second insulating layer is a distributed Bragg reflector layer, the distributed Bragg reflector layer comprises a plurality of film layers stacked alternately and having different refractive indexes, and a thickness of each of the film layers is between $\frac{1}{4}$ to $\frac{1}{2}$ of a light emitting wavelength of the light emitting layer.

7. The micro light emitting diode structure as claimed in claim 1, wherein the first insulating layer expose the first type semiconductor layer on the top surface to form a first opening, and expose the second portion of the second type semiconductor layer on the mesa surface to form a second opening, and the micro light emitting diode structure further comprises:

a first electrode, disposed in the first opening and electrically connected to the first type semiconductor layer; and a second electrode, disposed in the second opening and electrically connected to the second type semiconductor layer, wherein the first electrode and the second electrode both extend to the first insulating layer, and the first electrode and a part of the second electrodes are located on a same plane.

8. The micro light emitting diode structure as claimed in claim 1, wherein the second insulating layer covers the first insulating layer on the first side surface, and is aligned with the first insulating layer on the top surface of the mesa.

9. A micro light emitting diode structure, comprising:

an epitaxial structure, comprising a first type semiconductor layer, a light emitting layer and a second type semiconductor layer, wherein the light emitting layer is located between the first type semiconductor layer and the second type semiconductor layer, the first type semiconductor layer, the light emitting layer and a first portion of the second type semiconductor layer form a mesa, the mesa has a top surface and a first side surface, a second portion of the second type semiconductor layer is recessed relative to the mesa to form a mesa surface, the second portion has a second side surface, and the mesa surface is located between the first side surface and the second side surface;

a first insulating layer, directly covering from the top surface of the mesa to the mesa surface along the first side surface, and exposing the second side surface, wherein the first insulating layer covering the first side surface forms a continuous surface with the second side surface, and the continuous surface extends along and onto the second side surface; and a second insulating layer, disposed on the first insulating layer, and directly covering the continuous surface, wherein the first insulating layer directly contacts the second insulating layer.

* * * * *